United States Patent [19]
Kerfoot

[11] 4,006,269
[45] Feb. 1, 1977

[54] PHOTODEPOSITION OF METALS ON A NON-CONDUCTIVE SUBSTRATE

[75] Inventor: Derek G. E. Kerfoot, Pierrefonds, Canada

[73] Assignee: Canada Wire and Cable Limited, Canada

[22] Filed: Nov. 29, 1974

[21] Appl. No.: 528,210

[30] Foreign Application Priority Data
Dec. 3, 1973 Canada .............................. 187208

[52] U.S. Cl. .............................. 427/54; 427/92; 427/98; 427/306
[51] Int. Cl.² ...................... B05D 3/06; B05D 5/12
[58] Field of Search ............ 427/54, 304, 305, 306, 427/437, 438, 92, 98

[56] References Cited
UNITED STATES PATENTS

| | | | |
|---|---|---|---|
| 3,484,263 | 12/1969 | Kushihashi et al. .................. | 427/54 |
| 3,597,267 | 8/1971 | Mallory et al. ..................... | 427/437 |
| 3,738,849 | 6/1973 | Bellis ................................. | 427/437 |
| 3,772,056 | 11/1973 | Polichette et al. .................. | 427/54 |

Primary Examiner—John H. Newsome
Attorney, Agent, or Firm—Fleit & Jacobson

[57] ABSTRACT

A method for sensitizing a substrate of non-conductive material for the deposition thereon of a conductive film of copper or nickel comprises the steps of applying to the substrate a substance which can photochemically abstract a hydrogen atom from a hydrogen donor in the presence of a suitable solvent, and subsequently immersing the sensitized substrate in a solution containing certain metal ions such as copper, nickel or silver, and simultaneously exposing the sensitized substrate to radiation from an ultraviolet light source.

92 Claims, 3 Drawing Figures

PHOTODEPOSITION OF METALS ON A NON-CONDUCTIVE SUBSTRATE

This invention relates to the deposition of a conductive film of certain metals such as copper, silver, and nickel onto the surface of a non-conductive substrate for use in electrical or decorative applications.

Existing methods of metallizing non-conductors are based on electroless or chemical plating techniques in which, after an initial sensitization of the substrate with stannous chloride and activation with palladium chloride, metal deposition occurs by the chemical reduction of a soluble complex metal ion. These methods involve several process steps and the plating rate is slow, uneven, and difficult to control.

It is therefore the object of the present invention to provide a method for depositing a conductive film of copper, silver, or nickel of controlled thickness and conductivity onto a non-conductive substrate, which method consists of two steps only instead of the conventional sensitization-activation-electroless plating sequence, with intermediate rinse steps, of the prior art. This method also lends itself to selective deposition as used, for example, in the manufacture of printed circuits.

The present invention applies a known photochemical reaction, which consists of the abstraction of a hydrogen atom from a secondary alcohol or amine by a photochemically excited triplet molecule with the formation of a ketyl radical, to the metallizing of the non-conducting substrate. It has been surprisingly found that the ketyl radical can act as a sensitizer for the deposition of certain metals. This greatly simplifies the previous plating method which required both sensitization of the non-conductive substrate and activation thereof with the intermediate rinse steps.

On the basis of this discovery, a method for sensitizing a non-conductive substrate for the subsequent deposition of copper, silver and nickel has been developed. In such method, the non-conductive substrate to be metallized is first coated with a substance which can photochemically abstract a hydrogen atom from a suitable donor. The solution will thus include a sensitizer such as benzophenone and a hydrogen donor such as benzyhydrol in the presence of a suitable solvent. the sensitizer may also be the mono or dipara-substituted halogeno-, methyl, methoxy- and sulphonate-benzophenones. Other active sensitizers include acetophenone, benzaldehyde, phenazine, acridine, anthrone and anthraquinone.

Suitable solvents for the sensitizer include isopropyl alcohol, ethylene glycol and the polyethylene glycols in water.

When irradiated by an ultraviolet source emitting radiations in the spectral range of 200 to 400 m$\mu$, benzophenone (or any one of the above mentioned sensitizers) is excited to a triplet state which can abstract a hydrogen atom from a hydrogen donor to form a ketyl radical.

The above disclosed sensitizing method may be used for photochemically depositing copper on a non-conducting substrate. A sensitizer as disclosed above is first applied to the substrate and such substrate is subsequently immersed in a solution containing a complexed cupric ion in the presence of benzhydrol, a wetting agent and a suitable solvent such as isopropyl alcohol or dimethyl formamide in water and simultaneously exposed to ultraviolet radiations in the spectral range of 200 to 400 m$\mu$. Suitable complexed cupric ions include the cupric complexes of any chelating agents which can form a five-membered ring with the cupric ion by co-ordination through two amino groups or through one amino group and one carboxylic acid functional group. Suitable chelating agents are: ethylenediamine, diethylene triamine, triethylene tetramine, tetraethylene pentamine, ethylenediamine tetra-acetic acid and its salts, and glycine and its salts. The ketyl radical formed by irradiation of benzophenone (or any of the above mentioned sensitizers) will reduce the complexed cupric ion to the metallic state and thus plate the sensitized substrate with a conductive film of copper.

Using the above disclosed sensitizing method, conductive silver photodeposits have also been obtained from solutions of silver acetate in the presence of benzhydrol, and a suitable solvent, such as isopropanol in water.

In the above disclosed method for depositing copper, copper atoms are deposited on illuminated areas of the substrate to form an adherent conductive film while the sensitizing solution of benzopheone (or any of the above mentioned sensitzers) disperses into the plating solution. As the concentration of benzophenone in the irradiated plating solution increases, reduction of cupric ions to copper powder occurs in the body of the solution and, consequently, the plating bath is eventually deactivated.

It is therefore a further object of the present invention to increase the stability of the photodeposition plating bath by retarding the reduction of cupric ions by the ketyl radicals in the body of the plating solution, without reducing the rate of deposition at the substrate surface.

It has been found that certain additives to the plating solution have the effect of increasing bath stability considerably, at concentrations which do not deleteriously affect the rate of deposition of metal at the substrate surface. A suitable type of additive is one which can quench the benzophenone triplet state in the plating solution and thus prevent ketyl radical formation. Such additives include naphthalene, methyl-and halogeno-substituted naphthalenes, 2-aceto-naphthalene, 1-naphthaldehyde, cis-piperylene, azulene, cyclooctatetraene, benzil, and dibenzoylmethane. Several $\beta$-diketone chelates of transition metals such as tris (acetylacetonato) iron (III) are also effective triplet quenchers of this type.

Another type of additive is one which has been found to stabilize the plating solution itself and is capable of forming a water soluble complex with the cuprous ion. Indeed, the reduction of the cupric ion to copper is belived to involve the intermediate formation of a cuprous ion. Consequently, if the reduction sequence can be halted at the cuprous ion stage by the formation of a complex ion which is not susceptible to reduction by the ketyl radical, the formation of copper powder in the plating solution will be prevented. The following group of compounds has proved to be effective in stabilizing the photodeposition bath to ultraviolet irradiations without decreasing the deposition rate at the substrate:

a. cyanide or nitrile compounds, e.g. sodium cyanide,
b. acetylenic alcohols, e.g. methyl pentynol, propargyl alcohol,
c. covalent mercury compounds, e.g. phenyl mercuric acetate.

A stabilizer may also be added to a plating solution containing silver acetate to prevent the formation of silver powder in the solution. Suitable stabilizers include naphthalene, methyl-and halogeno-substituted naphthalenes, 2-aceto-naphthalene, 1-naphthaldehyde, cis-piperylene, azulene, cyclo-octatetraene, benzil, and dibenzoylmethane.

The above disclosed sensitizing method may also be used for depositing a film of a nickel-phosphorus alloy onto a non-conducting substrate. A sensitizer solution as disclosed above is first applied to the substrate and such substrate is subsequently immersed into a plating solution containing 1,3-propanediamine or ammonia complexes of a nickel (II) salt, or uncomplexed nickel acetate, in the presence of sodium hypophosphite and lactic acid in an aqueous-isopropanol or aqueous-dimethyl formamide solvent. The substrate is immersed in the plating solution while it is simultaneously irradiated by an ultraviolet source emitting radiations in the spectral range of 200 to 400 m$\mu$.

It has been found that copper-phosphorus alloys may also be deposited from solutions of ethylenediamine and 1,3-propanediamine complexes of copper (II), in the presence of sodium hypophosphite and lactic acid in an aqueous-isopropanol or aqueous-dimethyl formamide solvent. spectral range The above disclosed sensitizing method may further be used for photodepositing a film of nickel-boron alloy onto a non-conducting substrate. A sensitizer solution as disclosed above is first applied to the substrate and such a substrate is subsequently immersed in a plating solution containing an ethylenediamine complex of a nickel (II) salt in the presence of dimethylamine borane, sodium hydroxide in sufficient quantity to raise the pH of the solution above 11, and a suitable solvent consisting of 10 to 30% by volume (v/v) isopropanol or dimethyl formamide in water and simultaneously irradiated by an ultraviolet source emitting radiations in the spectral range of 200 to 400 m$\mu$.

The invention will now be disclosed, in more detail, with reference to the accompanying drawings illustrating flow charts in which.

The following description will be divided in the following sections to facilitate comprehension thereof:

a. Sensitization of a Non-Conductive Substrate,
b. Photodeposition of Copper and Silver
c. Stabilization of Copper or Silver Photodeposition Plating Solutions,
d. Photodeposition of nickel and copper from a Hypophosphite solution,
e. Photodeposition of nickel from a Dimethylamine Borane Solution.

a. Sensitization of a Non-Conductive Substrate

Figure 1:
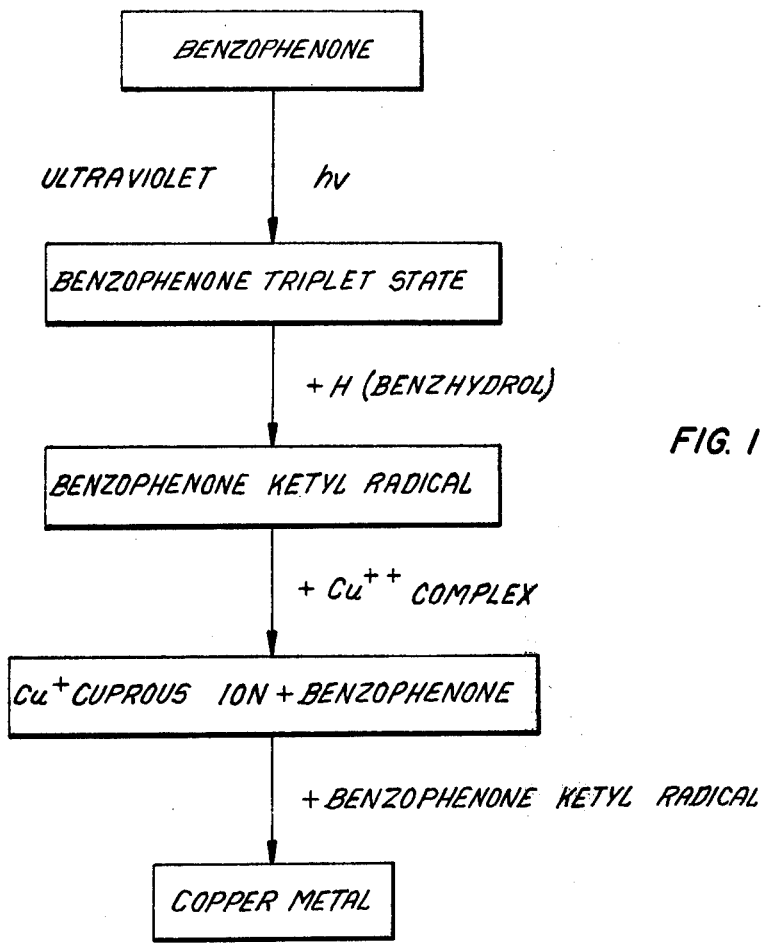
FIG. 1 illustrates the formation of a conductive film of copper on a non-conductive substrate.

In the flow chart of FIG. 1, it will be seen that benzophenone (or any of the above disclosed sensitizers), when excited photochemically by absorption of ultraviolet radiations, will be excited to a relatively long lived triplet energy state. The energetically excited molecule will abstract a hydrogen atom from a suitable donor such as a secondary alcohol to form a ketyl radical. This photochemical reaction is well known and a more detailed description thereof may be found in "Organic Photochemistry" by R. O. Kan, published by McGraw-Hill Book Co., New York 1966, page 222, or in "Photochemistry" by Calvert and Pitts, published by Wiley & Sons Inc., New York, 1966, page 282.

As metnioned previously, it has been found that any photochemically excited species which can abstract a hydrogen atom from a suitable donor such as a secondary alcohol will show sensitizing activity in the photodeposition of metals such as copper, silver and nickel. Other suitable sensitizers, apart from benzophenone, are the para-substitued halogeno-, methyl-, methoxy- and sulphonate-benzophenones. Other active sensitizers include acetophenone, benzaldehyde, phenazine, acridine, anthrone and anthraquinone.

The non-conductive substrate to be sensitized is thus treated with a solution containing a benzophenone (or any of the above mentioned sensitizers) and a hydrogen donor such as benzhydrol, in the presence of a suitable solvent such as isopropyl alcohol, ethylene glycol and polyethylene glycols, subsequently immersed in a plating solution containing certain metal ions such as copper, nickel or silver, and simultaneously irradiated by an ultraviolet source emitting radiations in the spectral range of 200 to 400 m$\mu$.

Unglazed ceramics can be sensitized directly, while glass, plastics and glazed ceramics should be pretreated by one of the prior art etching treatments to increase the metal to substrate adhesion.

b. Photodeposition of Copper or Silver

As mentioned above, the sensitizing solution is used to initiate photodeposition of a conductive film of copper on the surface of a non-conductive substrate. As shown in the flow chart of FIG. 1, it has been found that the benzophenone (or any of the above mentioned sensitizers) ketyl radicals will reduce certain complexed cupric ions ($Cu^{++}$ complex) to form copper metal. The reaction is believed to occur in two steps: first of all a cuprous ion ($Cu^+$) is formed with the reformation of benzophenone and in a second reaction, the cuprous ion is reduced by the benzophenone ketyl radical to form copper metal.

As mentioned previously, the complexed cupric ions which undergo photoreduction include five-membered ring cupric ion chelates formed by co-ordination through two amino groups or through one amino group and one carboxylic acid functional group. Suitable chelating agents include ethylenediamine, diethylenetriamine, triethylenetetramine, tetraethylenepentamine, ethylenediamine tetra-acetic acid and its salts, and glycine and its salts. Ethylenediamine is the preferred chelating agent. The plating solution also includes benzhydrol, a wetting agent such as sodium lauryl sulphate and a suitable solvent such as isopropyl alcohol or dimethylformamide in water.

It has been found experimentally that the following range of compositions is suitable for the photodeposition of copper:

| | | |
|---|---|---|
| copper sulphate pentahydrate | 0.005 to 0.10 Molar | mole per liter of total composition; |
| ethylenediamine | 0.02 to 0.60 | " |
| benzhydrol | 0.02 to 0.5 | " |
| sodium lauryl sulphate | 0.001 to 0.01 | " |
| solvents | 20 to 50% v/v isopropyl alcohol in water or 20 to 50% v/v dimethyl formamide in water. | |

The surface resistivity of deposit after four exposures of 3 minutes each for various plating bath compositions is given in the following Table I for solutions using the copper ethylenediamine complex in aqueous isopropyl alcohol sovent, and in the following Table II using again the copper ethylenediamine complex but in an aqueous dimethylformamide solvent.

ohm/square have been deposited in 15 minutes on a substrate 6 cm from the lamp. Such a deposit is suitable for intensification by electroplating or any other conventional electroless plating methods.

Although copper has been primarily specified, the above photodeposition process is not confined to copper. Conductive metal photodeposits have been ob-

TABLE I

PHOTODEPOSITION FROM SOLUTIONS OF THE COPPER ETHYLENEDIAMINE COMPLEX IN AQUEOUS ISOPROPYL ALCOHOL SOLVENT

| Copper Concentration (mole per liter of total composition) | Ethylenediamine Concentration (mole per liter of total composition) | Surface Resistivity of Deposit after 4 × 3 min. Exposure (ohm/square) |
|---|---|---|
| 0.01 | 0.06 | 100 |
| 0.02 | 0.12 | 1,000 |
| 0.04 | 0.24 | 2,000 |
| 0.06 | 0.36 | 200 |
| 0.10 | 0.60 | 500 |
| 0.01 | 0.04 | 500 |
| 0.01 | 0.08 | 2,000 |
| 0.01 | 0.12 | 5,000 |

Polyester substrate sensitized with 4-bromobenzophenone
Solution Composition:   0.025 mole per liter of total composition; Benzhydrol
              0.005 mole per liter of total compositon; Soidum lauryl sulphate
Solvent: 25% v/v isopropyl alcohol in water
300 watt medium pressure mercury lamp

TABLE II

PHOTODEPOSITION FROM SOLUTIONS OF THE COPPER ETHYLENEDIAMINE COMPLEX IN AQUEOUS DIMETHYLFORMAMIDE SOLVENT

| Copper Concentration mole per liter of total composition | Ethylenediamine Concentration mole per liter of total composition | Surface Resistivity of Deposit after 4 × 3 min. Exposure. (ohm/square) |
|---|---|---|
| 0.01 | 0.06 | 1,000 |
| 0.02 | 0.12 | 5,000 |
| 0.06 | 0.36 | $10^8$ |
| 0.10 | 0.60 | $10^8$ |
| 0.01 | 0.03 | 200 |
| 0.01 | 0.04 | 100 |
| 0.01 | 0.06 | 1,000 |
| 0.01 | 0.08 | 3,000 |
| 0.01 | 0.12 | $10^8$ |

Polyester sensitized with 4-bromobenzophenone
Solution Composition:   0.05 mole per liter of total composition; Benzhydrol
              0.005 mole per liter of total composition; Sodium lauryl sulphate
Solvent: 25% v/v dimethylformamide in water
300-watt medium pressure mercury lamp The above experimental results have been obtained by exposing to an ultraviolet source in a spectral range of 200 to 400 m$\mu$ a substrate previously treated by the above disclosed sensitizer solution and while it is immersed in the above disclosed plating solution. Medium pressure mercury and xenon arc lamps, and nitrogen lasers with emission at about 340 m$\mu$ are suitable. The major factors affecting the exposure time required to deposit a conductive film are the lamp intensity, and the lamp to substrate distance. Using a 300-watt General Electric UA3 lamp, deposits of film resistivity 50 tained from solutions of silver acetate in the presence of benzhydrol, and a suitable solvent such as isopropanol in water.

c. Stabilization of Copper or Silver Photodeposition Plating Solutions

In the above disclosed method, copper metal is deposited on the substrate in the plating bath to form an adherent conductive film thereon but, in the reduction of the cupric ion(Cu$^{++}$) to the copper atom by ketyl radicals, benzophenone (or any of the above mentioned sensitizers) disperses into the plating solution. Therefore, as the concentration of benzophenone in the irradiated plating solution increases, reduction of cupric ions to copper powder occurs in the body of the solution with consequent decomposition of the plating bath.

It has been found that certain additives to the plating solution have the effect of increasing bath stability considerably at concentrations which do not deleteriously affect the rate of deposition of metal at the substrate surface. The useful additives fall into two distinct categories which can be described by reference to the reaction charts of FIGS. 2 and 3.

As mentioned previously, benzophenone (or any one of the above mentioned sensitizers) is excited photochemically, by absorption of ultraviolet radiation, to the relatively long lived triplet energy state. The energetically excited molecule abstracts a hydrogen atom from a donor such as benzhydrol which is present in the solution to form a ketyl radical. The ketyl radical reduces the cupric ion to copper metal by a two-stage process which proceeds via the intermediate cuprous oxidation state.

The additives which are effective stabilizers for the photodeposition solution are molecules which are capable of breaking this reation sequence, but which do not react with any component of the solution in the absence of ultraviolet irradiation.

Figure 2:
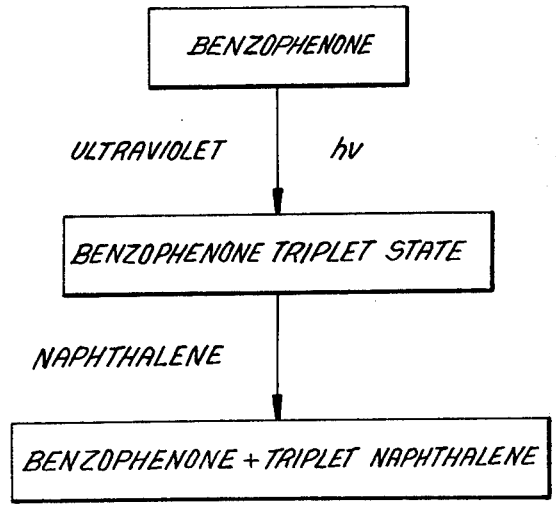
FIG. 2 illustrates the flow chart of the stabilization of copper photodeposition plating solutions by triplet quenching.

As illustrated in FIG. 2, the first type of molecule which has been found to stabilize the photodeposition solution is one which is capable of deactivating the excited benzophenone triplet state molecule by a physical energy transfer process, known as "quenching". The quenching molecule is itself excited to a triplet energy state but since it is not capable of forming a ketyl radical by hydrogen abstraction, the excitation energy is dissipated as vibrational or thermal energy. Additives of this type which can quench the benzophenone triplet state, and thus prevent ketyl radical formation, include naphthalene, methyl- and halogeno-substituted naphthalenes, 2-aceto-naphthalene, 1-naphthaldehyde, cis-piperylene, azulene, cyclo-octatetraene, benzil, and dibenzoylmethane. Several β-diketone chelates or transition metals such as tris (acetylacetonate) iron (III) are also effective triplet benzophenone quenchers of this type, although they are themselves susceptible to photodecomposition which limits their use as stabilizers for the photodeposition solution.

The following Table III records data showing the marked stabilizing effect of naphthalene additions on photodeposition solutions, and the effect of these additions on the rate of photodeposition at the substrate surface.

TABLE III

| STABILIZATION BY NAPHTHALENE QUENCHING | | |
|---|---|---|
| Naphthalene Content (ppm) | Time to Decomposition* (min.) | Deposit Resistivity after 15 min. Exposure (ohm/square) |
| 0 | 5 | 500 |
| 50 | n/m | 500 |
| 100 | 10 | 200 |
| 150 | 60 | n/m |
| 200 | n/m | 50,000 |
| 250 | 180 | n/m |
| 500 | n/m | $10^8$ |

*Solutions destabilized by addition of 20 ppm benzophenone. n/m Not measured.

Figure 3:
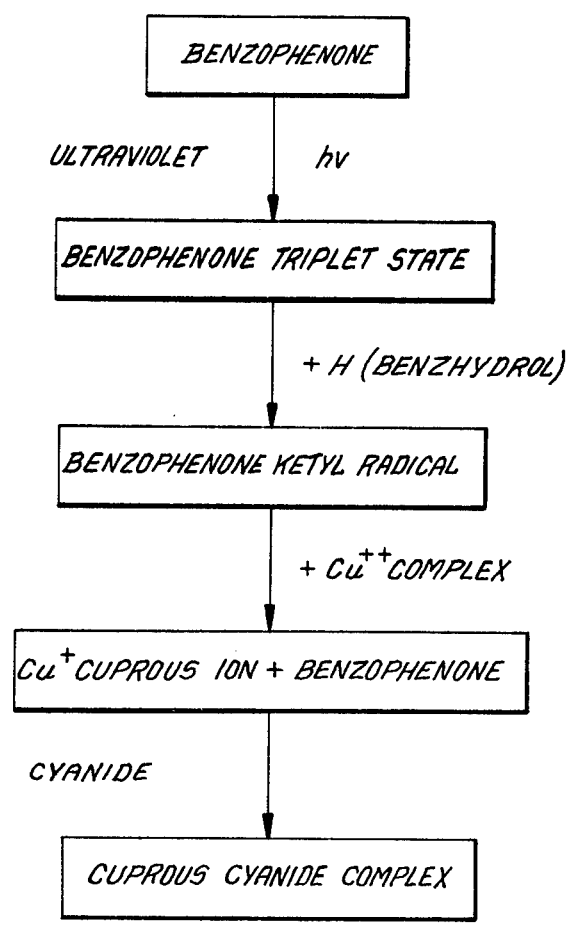
FIG. 3, illustrates another method of stabilizing a copper plating solution, by cuprous ion complex formation.

The second type of additive which has been found to stabilize the solution is a molecule which is capable of forming a water soluble complex with the cuprous ion. As shown in FIG. 3, the reduction of the cupric ion to copper involves the intermediate formation of the cuprous ion. Consequently, if the reaction sequence can be halted at the cuprous ion stage by the formation of a complex ion which is not susceptible to reduction by the ketyl radical, the formation of copper powder in the solution will be prevented and the stability of the solution will be increased. A further requirement for a successful stabilizer is that it must not interact with the cupric-ethylenediamine complex in the plating solution. Consequently, molecules which co-ordinate to the cuprous ion through a sulphur atom cannot be used for the stabilization of photodeposition solutions.

Groups of compounds which have proved to be effective in stabilizing the photodeposition bath to ultraviolet irradiation without significantly decreasing the deposition rate at the substrate include:
 a. cyanide or nitrile compounds, e.g. sodium cyanide,
 b. acetylenic alcohols, e.g. methyl pentynol, propargyl alcohol,
 c. covalent mercury compounds, e.g. phenyl mercuric acetate.

The following Table IV records data illustrating the stabilizing effect of methyl pentynol, phenyl mercuric acetate and sodium cyanide.

TABLE IV

| STABILIZATION BY COMPLEXING OF CUPROUS ION | | | |
|---|---|---|---|
| Stabilizing Agent | Concentration (ppm) | Time to Decomposition (min.) | Deposit Resistivity After 15 min. Exposure (ohm/square) |
| None | 0 | 9 | n/m |
| Sodium Cyanide | 20 | >30 | $10^5$ |
| Sodium Cyanide | 40 | >30 | $10^5$ |
| Sodium Cyanide | 50 | >30 | n/m |
| None | 0 | 5 | n/m |
| Methyl pentynol | 100 | >150 | n/m |
| Methyl pentynol | 150 | n/m | 100 |
| None | 0 | 12 | n/m |
| Phenyl mercuric acetate | 50 | >20 | $10^6$ |
| (Methyl pentynol (Phenyl mercuric acetate | 150) 50) | >180 | 100 |
| None | 0 | 30 | n/m |
| (Methyl pentynol Naphthalene | 100) 100) | >180 | 100 | n/m = not measured

In the photodeposition of silver, the plating solution including silver acetate may be stabilized to prevent formation of powders in the solution by additives which can quench the triplet state and thus prevent ketyl radical formation. Such additives may include, naphthalene, methyl- and halogeno-substituted naphthalene, 2-acetonaphthalene, 1-naphthaldehyde, cis-piperylene, azulene, cyclo-octatetraene, benzil, or dibenzaylmethane.

d. Photodeposition of Nickel and Copper from a Hypophosphite Solution

The above disclosed sensitizing solution has also been used for photodepositing a film of a conductive nickelphosphorus alloy onto a non-conductive substrate. The sensitizer solution is applied either by dipping or by spraying and the sensitizer concentration is preferably in the range of 0.05 to 0.3. mole per liter of total composition.

The plating solution which has been found to be suitable contains 1,3-propanediamine or ammonia complexes of nickel (II), or nickel acetate, in the presence of sodium hypophosphite. The 1,3-propanediamine complex of nickel is the preferred species for photodeposition. Lactic acid and citric acid are added to the solution in an aqueous isopropanol solvent in order to increase the metal deposition rate.

The mechanism by which the ketyl radical, the complexed nickel ion, and the hypophosphite ion interact to produce the metal is not completely understood, but photodeposition has been experienced in practice.

The solution composition should preferably be in the following range:

mation of powders in the solution. Suitable stabilizers are additives which can quench the triplet state and thus prevent the ketyl radical formation such as naphthalene, methyl- and halogeno- substituted naphthalene, 2-acetonaphthalene, 1-naphthaldehyde, cis-piperylene, azulene, cyclooctatetraene, benzil, or dibenzoylmethane.

e. Photodeposition of Nickel from a Dimethylamine Borane Solution

The above disclosed sensitizing solution has also been used for depositing a film of a nickel-boron alloy on the surface of a non-conductive substrate. The sensitizer solution may be applied by dipping or by spraying and the sensitizer concentration should be preferably in the range of 0.05 to 0.3 mole per liter of total

| nickel salt (chloride or sulphate) | 0.005 to 0.10 | mole per liter of total composition; |
| --- | --- | --- |
| 1,3-propanediamine | 0.04 to 0.5 | " |
| sodium hypophosphite | 0.005 to 0.5 | " |
| lactic acid | 0.01 to 0.05 | " |
| solvent | 20 to 30% isopropanol in water | |

The following Table V indicates the effect of solution composition changes on the plating rate.

composition.

Any substrate which is hydrophilic or has been ren-

TABLE V

EFFECT OF PLATING SOLUTION COMPOSITION ON PHOTODEPOSIT RESISTIVITY

Solution Composition

| $NiCl_2 6H_2O$ ($10^{-2}$ mole per liter of total composition) | 1,3-Propane diamine ($10^{-2}$ mole per liter of total composition) | Lactic Acid ($10^{-2}$ mole per liter of total composition) | Sodium Hypophosphite ($10^{-2}$ mole per liter of total composition) | Resistivity of Deposit after 3 × 3 min. exposure (ohm/square) |
| --- | --- | --- | --- | --- |
| 1 | 4 | 3 | 10 | 1,000 |
| 1 | 8 | 3 | 10 | 1,200 |
| 1 | 16 | 3 | 10 | 50,000 |
| 1 | 4 | 1 | 10 | 1,000 |
| 1 | 8 | 5 | 10 | 2,000 |
| 1 | 4 | 3 | 20 | 10,000 |
| 1 | 4 | 3 | 5 | 10,000 |

Operating Temperature 30° to 40° C
Solvent - 25% v/v isopropanol - water
Sensitizer - 4 - Bromobenzophenone (0.15 mole per liter of total composition); in isopropanol
Substrate - Polyester pretreated in  (a) ammonium persulphate
 (b) chromic acid.

Although nickel has been primarily specified, the above photodeposition process is not confined to nickel. Conductive metal photodeposits have been obtained from solutions of the ethylenediamine, and 1,3-propanediamine complexes of copper (II), in the presence of sodium hypophosphite, lactic acid, and a suitable solvent such as isopropanol in water.

Radiation sources emitting in the spectral range of 200 to 400 m$\mu$, such as medium pressure mercury and xenon arc lamps are suitable for the photodeposition process. Using a General Electric UA3 lamp, deposits of a surface resistivity of 100 ohm/square have been deposited in 9 minutes on a polyester substrate 6 cm from the lamp.

The plating solution containing the above mentioned nickel or copper ions may be stabilized to prevent fordered hydrophilic by prior art methods, of preparing substrates for metallizing is suitable. Plastic and ceramic materials have been successfully plated by photodeposition.

The plating solution which has been found suitable contains an ethylenediamine complex of a nickel (II) salt in the presence of sodium hydroxide in an aqueous isopropyl alcohol solvent. The pH of the solution is critical with deposition only occuring when sodium hydroxide is added to raise the pH above 11.

The mechanism by which the ketyl radical, the complexed nickel ion, and the borane molecule interact to produce the metal is not fully understood, but photodeposition has been experienced in practice.

The plating solution composition is preferably in the following range:

| nickel salt (chloride or sulfate) | 0.005 to 0.10 | mole per liter of total composition |
| --- | --- | --- |
| ethylenediamine | 0.04 to 0.6 | " |
| dimethylamine borane | 0.01 to 0.04 | " |

-continued

| | |
|---|---|
| sodium hydroxide | >0.1 N |
| pH | 11 |
| solvent | 10 to 30% v/v isopropanol in water |

The following Table VI summarizes the effect of changes of solution composition on plating rate.

TABLE VI
EFFECT OF PLATING SOLUTION COMPOSITION ON PHOTODEPOSIT RESISTIVITY

| Solution Composition | | | | | |
|---|---|---|---|---|---|
| $NiCl_2 6H_2O$ ($10^{-2}$ mole per liter of total composition); | Ethylene-diamine ($10^{-2}$ mole per liter of total composition); | DMAB ($10^{-2}$ mole per liter of total composition); | pH | % IPA in water | Resistivity of Deposit after 3 × 3 min. exposure (ohm/square) |
| 1 | 6 | 2 | 11.5 | 25 | 20 |
| 1 | 6 | 4 | 11.5 | 25 | 50 |
| 1 | 6 | 1 | 11.5 | 25 | 70 |
| 1 | 12 | 2 | 11.5 | 25 | 200 |
| 2 | 12 | 2 | 11.5 | 25 | 500 |
| 3 | 18 | 2 | 11.5 | 25 | 15 |
| 8 | 50 | 2 | 11.5 | 25 | 50 |
| 1 | 6 | 2 | 11.5 | 50 | $10^8$ |
| 1 | 6 | 2 | 11.5 | 10 | 200 |

Operating temperature 30–40° C
Sensitizer - 4-Bromobenzophenone (0.15 mole per liter of total composition) in isopropanol
Substrate - Polyester pretreated in     (a) ammonium persulphate
                                                    (b) chromic acid The plating solution containing the above mentioned nickel ions may be stabilized to prevent formation of powders in the solution. Suitable stabilizers are additives which can quench the triplet state and thus prevent the ketyl radical formation such as naphthalene, 2-acetonaphthalene, 1-naphthalaehyde, cis-piperylene, azulene, cyclo-octatetraene, benzil, or dibenzoylmethane.

In the above disclosed plating method, masking may be used so as to expose predetermined areas of the substrate and so permit selective deposition of a conductive film of metal on the non-conductive substrate.

What is claimed is:

1. A method of plating a substrate of non-conductive material with a conductive film of predetermined metals comprising the steps of:
   a. applying to said substrate a sensitizing solution containing a sensitizer, a hydrogen donor and a solvent, said sensitizer being capable, upon photochemical activation, of abstracting a hydrogen atom from said hydrogen donor in the presence of said solvent thereby becoming a ketyl radical;
   b. subsequently immersing said substrate in a plating solution containing predetermined metal ions; and
   c. irradiating said substance after treatment by said sensitizing solution and while said substrate is immersed in said plating solution with an ultraviolet source emitting radiations in the spectral range of 200 to 400 mµ to generate said ketyl radical for reducing the metal ions to metal.

2. A method as defined in claim 1, wherein said substrate is made of unglazed ceramics.

3. A method as defined in claim 1, wherein said substrate is selected from the group consisting of glass, plastics and glazed ceramics.

4. A method as defined in claim 1, wherein said sensitizer is selected from the group consisting of benzophenone, mono or di-para-substituted halogeno-, methyl-, methoxy- and sulphonate- benzophenones.

5. A method as defined in claim 1, wherein said sensitizer is selected from the group consisting of acetophenone, benzaldehyde, phenazine, acridine, anthrone and anthraquinone.

6. A method as defined in claim 1, wherein said hydrogen donor is a secondary alcohol.

7. A method as defined in claim 6, wherein said secondary alcohol is benzhydrol.

8. A method as defined in claim 1, wherein said solvent is selected from the group consisting of isopropyl alcohol, ethylene glycol and the polyethylene glycols.

9. A method of plating a substrate of non-conductive material with a conductive layer of copper comprising the steps of:
   a. applying to said substrate a sensitizing solution containing a sensitizer, a hydrogen donor and a first solvent, said sensitizer being capable, upon photochemical activation, of abstracting a hydrogen atom from said hydrogen donor in the presence of said first solvent thereby becoming a ketyl radical;
   b. subsequently immersing said substrate in a plating solution containing complexed cupric ions in the presence of a second solvent, said complexed cupric ions being selected from the group including the cupric complexes of the chelating agents which can form a five-membered ring with the cupric ion by co-ordination through two amino groups or through one amino group and one carboxylic acid functional group; and
   c. irradiating said substrate after treatment by said sensitizing solution and while said substrate is immersed in said plating solution with an ultraviolet source emitting radiations in the spectral range of 200 to 400 mµ to generate said keytl radical for reducing the cupric ions to copper.

10. A method as defined in claim 9, wherein said substrate is made of unglazed ceramics.

11. A method as defined in claim 9, wherein said substrate is selected from the group consisting of glass, plastics, and glazed ceramics.

12. A method as defined in claim 9, wherein said sensitizer is selected from the group consisting of benzophenone, mono or di-para-substituted halogeno-, methyl-, methoxy- and sulphonate-benzophenones.

13. A method as defined in claim 9, wherein said sensitizer is selected from the group consisting of acetophenone, benzaldehyde, phenazine, acridine, anthrone and anthraquinone.

14. A method as defined in claim 9, wherein said hydrogen donor is a secondary alcohol.

15. A method as defined in claim 14, wherein said secondary alcohol is benzhydrol.

16. A method as defined in claim 9, wherein said first solvent is selected from the group consisting of isopropyl alcohol, ethylene glycol and the polyethylene glycols.

17. A method as defined in claim 9, wherein the chelating agents are selected from the group consisting of ethylenediamine, diethylenetriamine, triethylenetetramine, tetraethylenepentamine, ethylenediamine tetra-acetic acid and its water soluble salts, and glycine and its water soluble salts.

18. A method as defined in claim 9, wherein the second solvent of the plating solution is selected from the group consisting of isopropyl alcohol and dimethyl formamide in water.

19. A method as defined in claim 9, wherein a wetting agent is added to the plating solution.

20. A method as defined in claim 19, wherein said wetting agent is sodium lauryl sulphate.

21. A method as defined in claim 20, wherein benzhydrol is added to the plating solution.

22. A method as defined in claim 21, wherein the plating solution comprises:

| | | |
|---|---|---|
| copper sulphate pentahydrate | 0.005 to 0.10 | mole per liter of total composition |
| ethylenediamine | 0.02 to 0.60 | " |
| benzhydrol | 0.02 to 0.5 | " |
| sodium lauryl sulphate | 0.001 to 0.01 | " |
| solvents | 20 to 50% v/v isopropyl alcohol in water | |
| or | 20 to 50% v/v isopropyl formamide in water. | |

23. A method as defined in claim 9, wherein a stabilizer is added to the plating solution to prevent formation of copper powders in the solution.

24. A method as defined in claim 23, wherein said stabilizer is selected from the group consisting of naphthalene, methyl- and halogeno-substituted napthalenes, 2-aceto-naphthalene, 1-naphthaldehyde, cis-piperylene, azulene, cyclo-octatetraene, benzil, and dibenzoylmethane.

25. A method as defined in claim 23, wherein the stabilizer is selected from the group consisting of β-diketone chelates of transition metals.

26. A method as defined in claim 23, wherein the stabilizer is selected from the group consisting of cyanide or nitrile compounds, acetylenic alcohols and covalent mercury compounds.

27. A method as defined in claim 9, wherein the temperature of the plating solution is varied between 30° and 40° C.

28. A method of plating a substrate of nonconductive material with a conductive layer of silver comprising the steps of:
 a. applying to said substrate a sensitizing solution containing a sensitizer, a hydrogen donor and a first solvent, said sensitizer being capable, upon photochemical activation, of abstracting a hydrogen atom from said hydrogen donor in the presence of said first solvent thereby becoming a ketyl radical;
 b. subsequently immersing said substrate in a plating solution containing silver acetate, benzhydrol and a second solvent; and
 c. irradiating said substrate after treatment by said sensitizing solution and while said substrate is immersed in said plating solution with an untraviolet source emitting radiations in the spectral range of 200 to 400 mμ to generate said ketyl radical for reducing the silver ions to silver.

29. A method as defined in claim 28, wherein said substrate is made of unglazed ceramics.

30. A method as defined in claim 28, wherein said substrate is selected from the group consisting of glass, plastics, and galzed ceramics.

31. A method as defined in claim 28, wherein said sensitizer is selected from the group consisting of benzophenone, mono or di-para-substituted halogeno-, methyl-, methoxy- and sulphonate-benzophenones.

32. A method as defined in claim 28, wherein said sensitizer is selected from the group consisting of acetopheone, benzaldehyde, phenazine, acridine, anthrone and anthraquinone.

33. A method as defined in claim 28, wherein said hydrogen donor is a secondary alcohol.

34. A method as defined in claim 33, wherein said secondary alcohol is benzhydrol.

35. A method as defined in claim 28, wherein said first solvent is selected from the group consisting of isopropyl alcohol, ethylene glycol and the polyethylene glycols.

36. A method as defined in claim 28, wherein the second solvent of the plating solution is selected from the group consisting of isopropyl alcohol and dimethyl formamide in water.

37. A method as defined in claim 28, wherein a stabilizer is added to the plating solution to prevent formation of silver powders in the solution.

38. A method as defined in claim 37, wherein said stabilizer is selected from the group consisting of naphthalene, methyl- and halogeno-substituted mehthalenes, 2-aceto-naphthalene, 1-naphthaldehyde, cis-piperylene, azulene, cyclo-octatetraene, benzil, and dibenzoylmethane.

39. A method as defined in claim 28, wherein the temperature of the plating solution is varied between 30° and 40° C.

40. A method of plating a substrate of non-conductive material with a conducting film of a nickel-phosphorus alloy comprising the steps of:
  a. applying to said substrate a sensitizing solution containing a sensitizer, a hydrogen donor and a first solvent, said sensitizer being capable, upon photochemical activation, of abstracting a hydrogen atom from said hydrogen donor in the presence of said first solvent thereby becoming a ketyl radical;
  b. subsequently immersing the sensitized substrate in a plating solution containing a complex of a nickel salt selected from a group consisting of 1,3-propanediamine and ammoniacal complexes of nickel, in the presence of sodium hypophosphite, and a second solvent; and
  c. irradiating said substrate after treatment by said sensitizing solution and while said substrate is immersed in said plating solution with an ultraviolet source emitting radiations in the spectral range of 200 to 400 m$\mu$ to generate said ketyl radical for reducing the nickel-phosporus complex to a nickel-phosphorus alloy.

41. A method as defined in claim 40, wherein said substrate is hydrophilic and made of plastic or ceramic materials.

42. A method as defined in claim 40, wherein the sensitizer is selected from the group consisting of benzophenone, mono- or di- para-substituted halogeno-, methyl-, methoxy- and sulphonate-benzophenones.

43. A method as defined in claim 40, wherein said sensitizer is selected from the group consisting of acetophenone, benzaldehyde, phenazine, acridine, anthrone and anthraquinone.

44. A method as defined in claim 40, wherein said hydrogen donor is a secondary alcohol.

45. A method as defined in claim 44, wherein said secondary alcohol is benzhydrol.

46. A method as defined in claim 40, wherein said first solvent is selected from the group consisting of isopropyl alcohol, ethylene glycol and the polyethylene glycols.

47. A method as defined in claim 40, wherein said second solvent is selected from the group consisting of isopropyl alcohol and dimethyl formamide in water.

48. A method as defined in claim 40, wherein a compound is added selected from the group consisting of lactic acid and citric acid to accelerate the plating rate and to enhance solution stability.

49. A method as defined in claim 40, wherein the temperature of the plating solution varied between 30 and 40° C.

50. A method as defined in claim 48, wherein a typical plating solution is in the following range:

thalene, methyl- and halogeno- substituted naphthalenes, 2-aceto-naphthalene, 1-naphthaldehyde, cis-piperylene, azulene, cyclo-octatetraene, benzil, and dibenzoylmethane.

53. A method of plating a substrate of non-conductive material with a conducting film of a nickel-phosphorus alloy comprising the steps of:
  a. applying to said substrate a sensitizing solution containing a sensitizer, a hydrogen donor and a first solvent, said sensitizer being capable, upon photochemical activation, of abstracting a hydrogen atom from said hydrogen donor in the presence of said first solvent thereby becoming a ketyl radical;
  b. subsequently immersing the sensitized substrate in a plating solution containing nickel acetate in the presence of sodium hypophosphite and a second solvent; and
  c. irradiating said substrate after treatment by said sensitizing solution and while said substrate is immersed in said plating solution with an ultraviolet source emitting radiations in the spectral range of 200 to 400 m$\mu$ to generate the ketyl radical for reducing the nickel-phosphorus complex to a nickel-phosphorus alloy.

54. A method as defined in claim 53, wherein said substrate is hydrophilic and made of plastic or ceramic materials.

55. A method as defined in claim 53, wherein the sensitizer is selected from the group consisting of benzophenone, mono- or di- para-substituted halogeno-, methyl-, methoxy- and sulphonate-benzophenones.

56. A method as defined in claim 53, wherein said sensitizer is selected from the group consisting of acetophenone, benzaldehyde, phenazine, acridine, anthrone and anthraquinone.

57. A method as defined in claim 53, wherein said hydrogen donor is a secondary alcohol.

58. A method as defined in claim 57, wherein said secondary alcohol is benzhydrol.

59. A method as defined in claim 53, wherein said first solvent is selected from the group consisting of isopropyl alcohol, ethylene glycol and the polyethylene glycols.

60. A method as defined in claim 53, wherein said second solvent is selected from the group consisting of isopropyl alcohol and dimethyl formamide in water.

61. A method as defined in claim 53, wherein a compound is added selected from the group consisting of lactic acid and citric acid to accelerate the plating rate and to enhance solution stability.

62. A method as defined in claim 53, wherein the temperature of the plating solution is varied between 30° and 40° C.

| | | |
|---|---|---|
| nickel salt (Chloride or sulphate) | 0.005 to 0.10 | mole per liter of total composition |
| 1,3-propanediamine | 0.04 to 0.5 | " |
| sodium hypophosphite | 0.005 to 0.5 | " |
| lactic acid | 0.01 to 0.05 | " |
| solvent | 20 to 30% isopropanol in water. | |

51. A method as defined in claim 40, wherein a stabilizer is added to the plating solution to prevent formation of nickel powders in the solution.

52. A method as defined in claim 51, wherein said stabilizer is selected from the group consisting of naph- 63. A method as defined in claim 53, wherein a stabilizer is added to the plating solution to prevent formation of nickel powders in the solution.

64. A method as defined in claim 63, wherein said stabilizer is selected from the group consisting of naphthalene, methyl- and halogeno- substituted naphthalenes, 2-aceto-naphthalene, 1-naphthaldehyde, cis-piperylene, azuelen, cyclo-octatetraene, benzil, and dibenzoylmethane.

65. A method of plating a substrate of non-conductive material with a conducting film of a copper-phosphorus alloy comprising the steps of:
   a. applying to said substrate a sensitizing solution containing a sensitizer, a hydrogen donor and a first solvent, said sensitizer being capable, upon photochemical activation, of abstracting a hydrogen atom from said hydrogen donor in the presence of said first solvent thereby becoming a ketyl radical;
   b. subsequently immersing the sensitized substrate in a plating solution containing ethylenediamine and 1,3-propanediamine complexes of copper (II), in the presence of sodium hypophosphite and a second solvent; and
   c. irradiating said substrate after treatment by said sensitizing solution and while said substrate is immersed in said plating solution with an ultraviolet source emitting radiations in the spectral range of 200 to 400 m$\mu$ to generate the ketyl radical for reducing the copper-phosphorus complex to a copper-phosphorus alloy.

66. A method as defined in claim 65, wherein said substrate is hydrophilic and made of plastic or ceramic materials.

67. A method as defined in claim 65, wherein the sensitizer is selected from the group consisting of benzophenone, mono- or di- para-substituted halogeno-, methyl-, methoxy- and sulphonate-benzophenones.

68. A method as defined in claim 65, wherein said sensitizer is selected from the group consisting of acetophenone, benzaldehyde, phenazine, acridine, anthrone and anthraquinone.

69. A method as defined in claim 65, wherein said hydrogen donor is a secondary alcohol.

70. A method as defined in claim 69, wherein said secondary alcohol is benzhydrol.

71. A method as defined in claim 65, wherein said first solvent is selected from the group consisting of isopropyl alcohol, ethylene glycol and the polyethylene glycols.

72. A method as defined in claim 65, wherein said second solvent is selected from the group consisting of isopropyl alcohol and dimethyl formamide in water.

73. A method as defined in claim 65, wherein a compound is added selected from the group consisting of lactic acid and citric acid to accelerate the plating rate and to enhance solution stability.

74. A method as defined in claim 65, wherein the temperature of the plating solution is varied between 30° and 40° C.

75. A method as defined in claim 65, wherein a stabilizer is added to the plating solution to prevent formation of copper powders in the solution.

76. A method as defined in claim 75, wherein said stabilizer is selected from the group consisting of naphthalene, methyl- and halogeno- substituted naphthalenes, 2-aceto-naphthalene, 1-naphthaldehyde, cis-piperylene, azulene, cyclo-octatetraene, benzil, and dibenzoylmethane.

77. A method of plating a substrate of non-conductive metal with a conductive film of a nickel-boron alloy comprising the steps of:
   a. applying to said substrate a sensitizing solution containing a sensitizer, a hydrogen donor and a first solvent, said sensitizer being capable, upon photochemical activation, of abstracting a hydrogen atom from said hydrogen donor in the presence of said first solvent thereby becoming a ketyl radical;
   b. subsequently immersing the sensitized substrate in a plating solution containing a nickel salt, ethylenediamine, dimethylamine borane, sodium hydroxide to raise the pH above 11, and a second solvent; and
   c. irradiating said substrate after treatment by said sensitizing solution and while said substrate is immeresed in said plating solution with an ultraviolet source emitting radiations in the spectral range of 200 to 400 m$\mu$ to generate the ketyl radical for reducing the nickel-boron complex to a nickel-boron alloy.

78. A method as defined in claim 77, wherein said substrate is hydrophilic and made of plastic or ceramic material.

79. A method as defined in claim 77, wherein said sensitizer is selected from the group consisting of benzophenone, mono- or di-para-substituted halogeno-, methyl-, mothoxy- and sulphonate-benzophenones.

80. A method as defined in claim 77, wherein said sensitizer is selected from the group consisting of acetophenone, benzaldehyde, phenazine, acridine, anthrone and anthraquinone.

81. A method as defined in claim 77, wherein said hydrogen donor is a secondary alcohol.

82. A method as defined in claim 81, wherein said secondary alcohol is benzhydrol.

83. A method as defined in claim 77, wherein said first solvent is selected from the group consisting of isopropyl alcohol, ethylene glycol and the polyethylene glycols.

84. A method as defined in claim 77, wherein said second solvent of the plating solution is selected from the group consisting of isopropyl alcohol and dimethyl formamide in water.

85. A method as defined in claim 77, wherein the temperature of the plating solution is varied between 30° and 40° C.

86. A method as defined in claim 77, wherein the plating solution is composed of:

| | | |
|---|---|---|
| nickel salt (chloride or sulphate) | 0.005 to 0.01 | mole per liter of total composition |
| ethylenediamine | 0.04 to 0.6 | " |
| dimethylamine borane | 0.01 to 0.04 | " |
| sodium hydroxide | 0.01 N | |
| pH | 11 | |
| solvent | 10 to 30% v/v isopropanol in water. | |

87. A method as defined in claim 77, wherein a stabilizer is added to the plating solution to prevent formation of nickel powders in the solution.

88. A method as defined in claim 87, wherein said stabilizer is selected from the group consisting of naphthalene, methyl- and halogeno- substituted naphthalenes, 2-aceto-naphthalene, 1-naphthaldehyde, cis-piperylene, azulene, cyclo-octatetraene, benzil, and dibenzoylmethane.

89. A method as defined in claim 3, wherein said substrate is pretreated to increase the metal to substrate adhesion.

90. A method as defined in claim 11, wherein the substrate is pretreated to increase the metal to substrate adhesion.

91. A method as defined in claim 25, wherein the stabilizer is tris (acetylacetonate) iron(III).

92. A method as defined in claim 30, wherein the substrate is pretreated to increase the metal to substrate adhesion.

* * * * *